United States Patent
Zyung et al.

[19]

[11] Patent Number: 5,876,786
[45] Date of Patent: Mar. 2, 1999

[54] METHOD OF MANUFACTURING ORGANIC/ POLYMER ELECTROLUMINESCENT DEVICE

[75] Inventors: Taehyoung Zyung; Sang-Don Jung; Kang-Hoon Choi, all of Daejon, Rep. of Korea

[73] Assignee: Electronics And Telecommunications Research Insitute, Taejon, Rep. of Korea

[21] Appl. No.: 919,929

[22] Filed: Aug. 28, 1997

[30] Foreign Application Priority Data

Aug. 28, 1996 [KR] Rep. of Korea .................. 1996-35936

[51] Int. Cl.⁶ ....................................... B05D 5/06
[52] U.S. Cl. ........................... 427/64; 427/162; 427/165; 427/261; 427/264; 427/265; 427/404; 427/407.1; 427/407.2
[58] Field of Search .............................. 427/64, 162, 165, 427/261, 264, 265, 404, 407.1, 407.2

[56] References Cited

U.S. PATENT DOCUMENTS 5,674,635 10/1997 Hsieh et al. ............................... 427/66
5,705,284 1/1998 Hosokawa et al. ..................... 428/690

FOREIGN PATENT DOCUMENTS 3-274695 12/1991 Japan .

*Primary Examiner*—Janyce Bell
*Attorney, Agent, or Firm*—Cohen, Pontani, Lieberman & Pavane

[57] ABSTRACT

A method of manufacturing an organic/polymer electroluminescent device to effectively inject electrons and holes by forming a film consisting of a charge transfer complex or charge transfer salt between a organic/polymer electroluminescent layer and electrodes for injecting electrons and holes in order to increase an electroluminescent quantum efficiency, is disclosed. The inventive structure of organic/polymer electroluminescent device comprises a transparent substrate. A plurality of transparent electrodes is formed on a selected portions of the transparent substrate. A first film is formed on the entire surface of the resulting structure including the plurality of transparent electrodes formed on the selected portions of the transparent substrate. An emissive layer formed on the first film. A second film is then formed on the luminous layer. A plurality of metal electrodes is formed on a selected portions of the second film.

7 Claims, 2 Drawing Sheets

METHOD OF MANUFACTURING ORGANIC/POLYMER ELECTROLUMINESCENT DEVICE

BACKGROUND OF THE INVENTION

1. Field of the Invention

The present invention relates to a method of manufacturing an organic/polymer electroluminescent device, and more particularly, to a method of manufacturing an organic/polymer electroluminescent device to effectively inject electrons and holes by inserting a film consisting of a charge transfer complex or charge transfer salt (Hereinafter, referred to as a charge transfer material) between an organic/polymer luminous layer and electrodes for injecting electrons and holes in order to increase an electroluminescent quantum efficiency.

2. Description of the Related Art

Numerous studies have been conducted concerning the manufacture of electroluminescent devices using an organic material or polymer. The organic material or polymer has advantages that it can be applied low costs and with simple treatments and easy compound process as compared to an inorganic material. These studies have been accelerated because it could be easily applied to a large flat panel display, which is difficult to be manufactured with the use of the inorganic material.

In manufacturing the electroluminescent devices using an organic conjugated polymer or organic plastid dyes, the electroluminescent quantum efficiency of the device depends on how to effectively inject the electrons and holes in the organic/polymer layer. In order to effectively inject the electrons and holes in the organic/polymer emissive layer from the electrodes made of metal, the interface and potential barrier between the organic/polymer layer and the electrodes become important parameters. In general, the organic/polymer emissive layer is coated on the electrons and holes transfer layer using a deposition process well known in the art. However, the electroluminescent quantum efficiency and durability of the device will deteriorate due to the presence of potential barrier between the organic material or polymer and the metal electrode.

Various method of increasing the electroluminescent quantum efficiency of the device for the electroluminescence has been proposed. For example, a method using a metal cathode having a low value of work function is small in order to effectively inject the electrons, a method of interposing the organic or polymer layer having a good charge transfer capability between the electroluminescent layer and the metal electrode, a method using an organic/polymer material having an electron affinity as a emissive layer, and so on. However, there is a drawback that the resulting electroluminescent quantum efficiency and durability of the device is deteriorated since the presence of potential barrier between the organic or polymer layer and the metal electrodes can not be eliminated, even in the use of any one of the methods described above.

It is therefore an object of the invention to provide a method of manufacturing an organic/polymer luminous device for increasing the electroluminescent quantum efficiency of the electroluminescent quantum device by introducing a film including charge transfer materials which has good conductivity and by removing an energy barrier between a metal layer and a charge transfer material, such that electrons and holes are effectively injected and charge transfer capability is improved.

SUMMARY OF THE INVENTION

For the purpose of summarizing the present invention, the method for manufacturing the structure of organic/polymer electroluminescent device comprises the steps of preparing a transparent substrate; depositing a transparent conducting layer on the transparent substrate; forming a plurality of the transparent electrodes on a selected portion of the transparent substrate by performing a patterning process of the transparent conducting layer; depositing a first film on the resulting structure including the plurality of the transparent electrodes; depositing a electroluminescent layer on the first film; and then depositing with the organic charge transfer layer on the emissive layer; The metal cathode formed on the charge transfer layer for forming a plurality of the metal electrodes on a selected portions of the second film by performing a patterning process of the metal layer, thereby obtaining the resulting organic/polymer electroluminescent device.

According to the present invention, the electroluminescent device has superior advantages because the electrons and holes are effectively inject by introducing the charge transfer materials between the organic/polymer layer and the electrodes, thereby increasing the efficiency of the electroluminescent device. Furthermore, according to the present invention, the possibility of the mass production of the device can also be increased, so that it can substitute the inventive structure of the organic/polymer electroluminescent device with the prior luminous device.

BRIEF DESCRIPTION OF THE DRAWINGS

The present invention will become more apparent upon a detailed description of the preferred embodiments for carrying out the invention as rendered below.

The operation of the embodiment of the present invention as discussed above will now be described in detail.

DETAILED DESCRIPTION OF THE INVENTION

Figure 1:
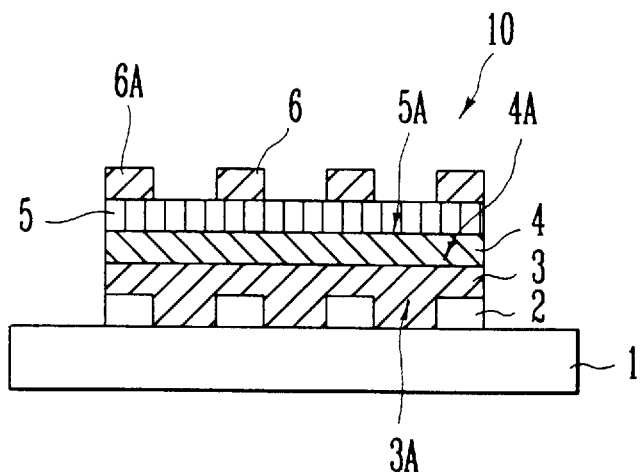
FIG. 1 is a sectional view representing an organic/polymer electroluminescent device according to a first embodiment of the present invention.

Referring now to FIG. 1, there is shown a sectional view of an organic/polymer electroluminescent device 10 according to the first embodiment of the present invention that the charge transfer material is formed between an electroluminescent layer and a metal cathode.

In the figure, patterned transparent electrodes 2 are formed on the selected portion of a transparent substrate 1. The first film 3A formed with the first charge transfer material 3 on the entire surface of the resulting structure using the spin coating or vacuum evaporation for the efficent hole injection to the organic or polymer layer. The organic or polymer 4 that acts as an electroluminescent layer 4A is deposited on the first layer 3A which formed with the charge transfer material. The second charge transfer material 5 is coated on the organic or polymer electroluminescent layer 4A in order to inject the electrons effectively to the organic or polymer layer. Finally, the patterned metal electrode 6 that had low work function is formed using a vacuum evaporation technique. A second film 5A formed with a second charge transfer material 5 is then deposited on the luminous layer 4A formed with the organic or polymer 4 in order to inject electrons. On the second film 5A formed with the second charge transfer material 5, a plurality of patterned metal electrodes 6 are formed as shown in the drawing.

FIGS. 2A to 2F are sectional views that illustrate the sequential steps of manufacturing the organic/polymer electroluminescent device according to the second embodiment of the present invention.

Figure 2A:
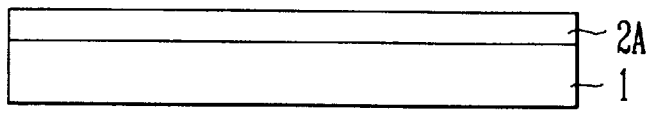
FIGS. 2A, 2B, 2C, 2D, 2E and 2F are sectional views sequentially illustrating the steps of manufacturing the organic/polymer electroluminescent device according to a second embodiment of the present invention.
Figure 2B:
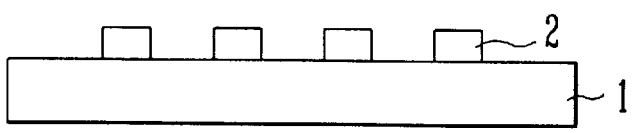
Figure 2C:
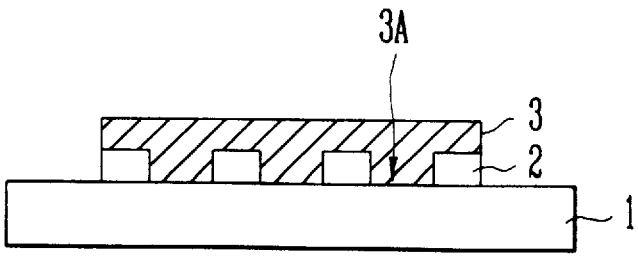

Turning now to FIG. 2A, it represents a transparent layer 2A for electrode with thin In-Sn oxide (ITO) is coated on the transparent substrate 1. FIG. 2B shows a cross sectional view of the patterned transparent electrode structure on the transparent substrate 1. The patterned transparent electrodes 2 performed by a wet etching process using acid with the structure illustrated in FIG. 2A. The first film 3A with charge transfer material that coated onto the entire surface of the resulting structure shows in FIG. 2C. The first charge transfer material 3 is layered using a spin coating or vacuum evaporation technique.

Figure 2D:
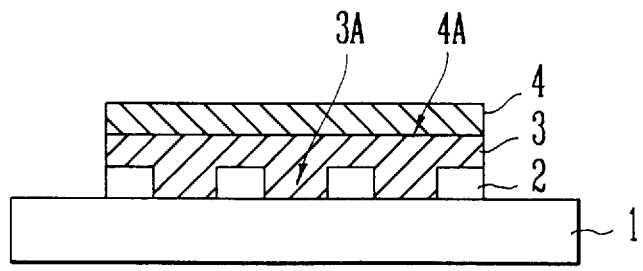
Figure 2E:
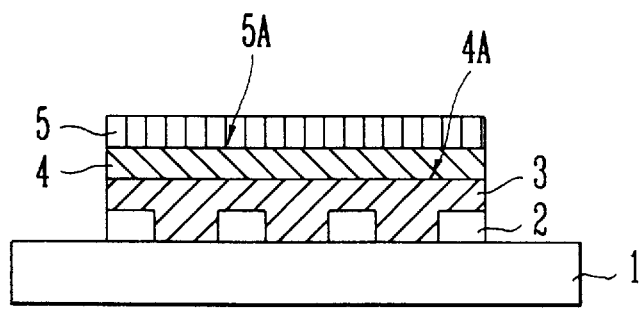

FIG. 2D shows that the electroluminescent layer 4A consisting of the organic or polymer 4 is deposited on the first film 3A which is formed with first charge transfer material 3. FIG. 2E illustrates that the second charge transfer material 5 is rigidly deposited on the electroluminescent layer 4A formed with the organic or polymer 4. The second charge transfer material 5 undergoes a spin coating or a vapor deposition process and is then dried, such that the resulting second film 5A is obtained.

Figure 2F:
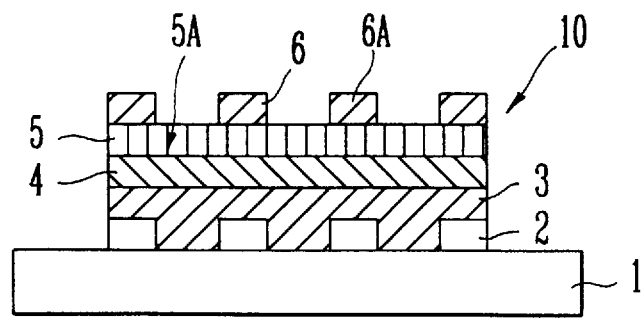

The FIG. 2F shows a cross sectional view in which a metal layer 6A is deposited on the second film 5A. A plurality of the metal electrodes 6 are formed on the selected portions of the second film 5A formed with the second charge transfer material 5 Finally, the resulting organic/polymer luminous device 10 is obtained.

The followings are chemical structure formulas of the materials which form the first and the second charge transfer material 3 and 5.

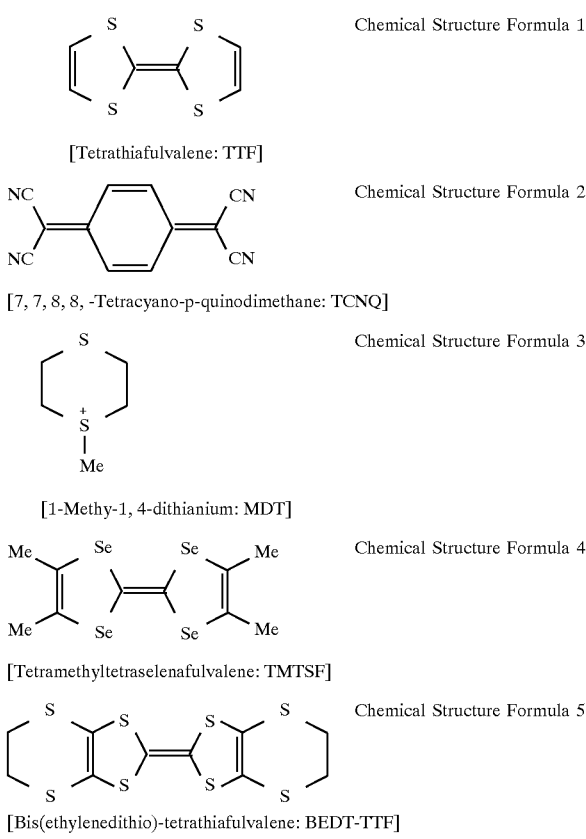
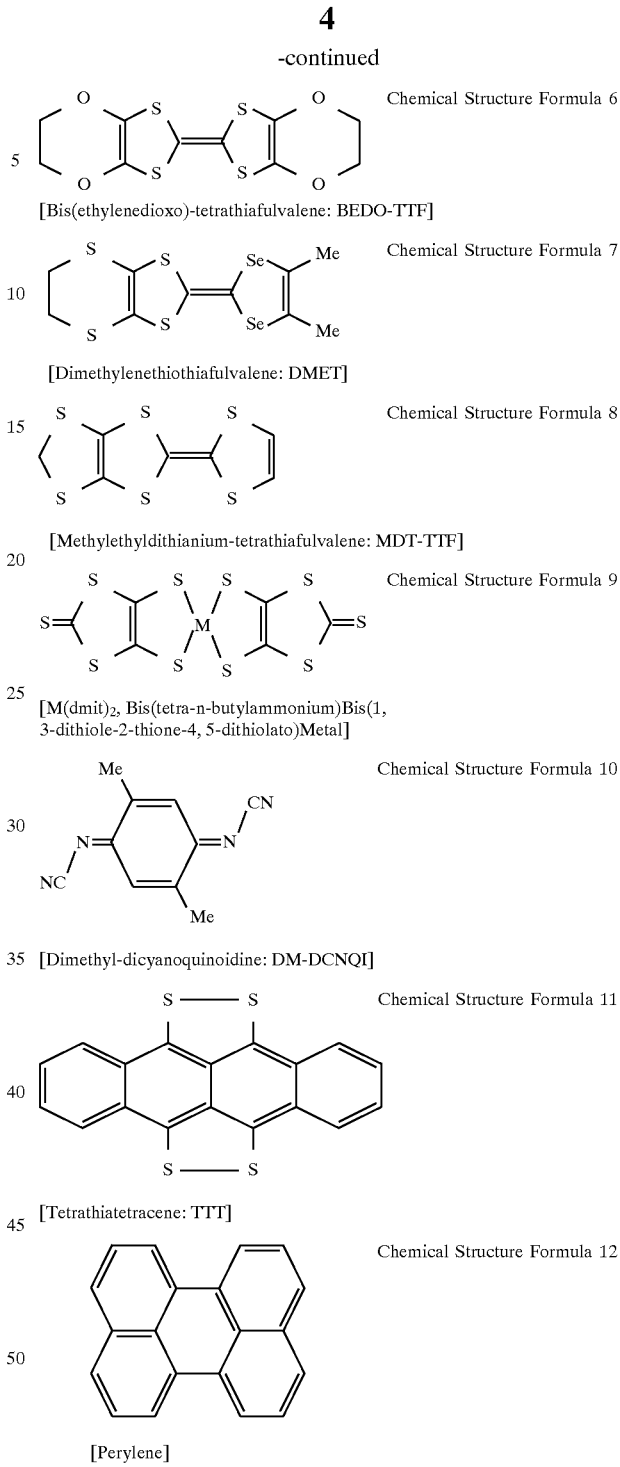

As fully described above, according to the structure of organic/polymer electroluminescent device of the present invention has superior advantages because the electrons and holes are effectively injected by introducing the charge transfer materials between the electroluminescent layer and the electrode, thereby increasing the efficiency of the organic/polymer electroluminescent device and the probability of the mass production of the device can also be increased, so that the inventive organic/polymer electrominescent device can replace prior art electrominescent devices.

The present invention has been described with reference to a particular embodiment in connection with a particular application. Those having ordinary skill in the art and access to the teachings of the present invention will recognize additional modifications and applications within the scope thereof, It is therefore intended by the appended claims to cover any and all such applications, modifications, and embodiments within the scope of the present invention.

What is claimed is:

1. A method of manufacturing an electroluminescent device comprising the steps of:

preparing a transparent substrate;

depositing a transparent layer on said transparent substrate;

forming a plurality of transparent electrodes on selected portions of said transparent substrate by patterning said transparent layer;

depositing a first film comprising a first charge transfer material on the resulting structure including the plurality of transparent electrodes;

depositing an emissive layer on said first film;

depositing a second film comprising a second charge transfer material on said emissive layer;

depositing a metal layer on said second film; and forming a plurality of metal electrodes on selected portions of said second film by patterning said metal layer, thereby obtaining the electroluminescent device.

2. The method according to claim 1, wherein said step of depositing a transparent layer includes depositing In-Sn oxide (ITO).

3. The method according to claim 1, wherein each of said steps of depositing said first film and said second film includes depositing one of a charge transfer complex and a charge transfer salt.

4. The method according to claim 1, wherein said step of depositing a first film includes the step of using one of a spin coating process and a vapor deposition process for depositing said first film.

5. The method according to claim 1, wherein the step of depositing emissive layer comprises depositing one of an electroluminescent organic material and an electroluminescent polymer.

6. The method according to claim 1, wherein said step of depositing a second film layer includes the step of using one of a spin coating process and a vapor deposition process for depositing said second film.

7. The method according to claim 1, wherein each of said steps of depositing the first film and the second film comprises the step of depositing one selected from the group consisting of Tetrathiafulvalene, 7,7,8,8,-Tetracyano-p-quinodimethane, 1-Methy-1,4-dithianium, Tetramethyltetraselenafulvalene, Bis(ethylenedithio)-tetrathiafulvalene, Bis (ethylenedioxo)-tetrathiafulvalene, Dimethylethylenethiothiafulvalene, Methylethyldithaniumtetrathiafulvalene,$M(dmit)_2$,Bis(tetra-n-butylammonium)Bis(1,3-dithiole-2-thione-4,5-dithiolato) Metal, Dimethyl-dicyanoquinoidine, Tetrathiatetracene, and Perylene.

* * * * *